United States Patent
Tadokoro et al.

(10) Patent No.: US 10,054,715 B2
(45) Date of Patent: *Aug. 21, 2018

(54) EYEGLASS LENS HAVING IMPROVED HEAT RESISTANCE AND SCRATCH RESISTANCE

(71) Applicant: HOYA CORPORATION, Tokyo (JP)

(72) Inventors: Nobuyuki Tadokoro, Tokyo (JP); Naomi Ogawa, Tokyo (JP); Makoto Adachi, Tokyo (JP); Yuko Komine, Tokyo (JP); Koushi Harada, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/430,269

(22) PCT Filed: Sep. 30, 2013

(86) PCT No.: PCT/JP2013/076601
§ 371 (c)(1),
(2) Date: Jun. 2, 2015

(87) PCT Pub. No.: WO2014/051151
PCT Pub. Date: Apr. 3, 2014

(65) Prior Publication Data
US 2015/0268384 A1    Sep. 24, 2015

(30) Foreign Application Priority Data

Sep. 28, 2012  (JP) ................ 2012-217200
Sep. 28, 2012  (JP) ................ 2012-217204

(51) Int. Cl.
*G02B 1/14*    (2015.01)
*G02C 7/02*    (2006.01)
(Continued)

(52) U.S. Cl.
CPC .............. *G02B 1/14* (2015.01); *C23C 14/083* (2013.01); *C23C 14/22* (2013.01); *C23C 14/24* (2013.01);
(Continued)

(58) Field of Classification Search
CPC .............. G02C 7/02; G02B 1/105; G02B 1/14
(Continued)

(56) References Cited

U.S. PATENT DOCUMENTS 4,161,560 A    7/1979  Kienel
4,742,030 A *  5/1988  Masaki ................ C04B 35/486
                                                   423/608
(Continued)

FOREIGN PATENT DOCUMENTS

CN    1264840 A     8/2000
CN    101241199 A   8/2008
(Continued)

OTHER PUBLICATIONS

International Search Report issued in PCT/JP2013/076601, dated Sep. 30, 2013.
(Continued)

*Primary Examiner* — Zachary Wilkes
(74) *Attorney, Agent, or Firm* — Sughrue Mion, PLLC

(57) ABSTRACT

An aspect of the present invention relates to an eyeglass lens comprising a lens substrate and a vapor-deposited film either directly or indirectly on the lens substrate, wherein the vapor-deposited film is an oxide film of metal selected from the group consisting of zirconium and tantalum, with an average grain size observed in a planar image obtained by a transmission electron microscope of equal to or greater than 3.5 nm and a proportion accounted for by grain boundaries, which are boundaries separating grains from regions outside
(Continued)

of the grains, in a planar image obtained by a transmission electron microscope of less than 15%.

9 Claims, 6 Drawing Sheets

(51) Int. Cl.
G02B 1/10 (2015.01)
C23C 14/24 (2006.01)
C23C 14/08 (2006.01)
G02B 1/12 (2006.01)
C23C 14/22 (2006.01)

(52) U.S. Cl.
CPC ............... *G02B 1/10* (2013.01); *G02B 1/105* (2013.01); *G02B 1/12* (2013.01); *G02C 7/02* (2013.01); *G02C 7/022* (2013.01); *G02C 2202/16* (2013.01)

(58) Field of Classification Search
USPC .................................................. 351/159.57
See application file for complete search history.

(56) References Cited

U.S. PATENT DOCUMENTS

| | | | |
|---|---|---|---|
| 5,508,092 A | 4/1996 | Kimock et al. | |
| 5,800,394 A | 9/1998 | Yoon et al. | |
| 5,800,934 A | 9/1998 | Qadri et al. | |
| 5,891,362 A | 4/1999 | Watanabe et al. | |
| 5,930,046 A | 7/1999 | Solberg et al. | |
| 6,001,164 A | 12/1999 | Watanabe et al. | |
| 9,376,327 B2* | 6/2016 | Morikawa | B01J 35/04 |
| 9,824,888 B2* | 11/2017 | Yamazaki | H01L 21/02565 |
| 2002/0060848 A1 | 5/2002 | Mitsuishi et al. | |
| 2006/0088466 A1 | 4/2006 | Friz et al. | |
| 2008/0002259 A1 | 1/2008 | Ishizawa et al. | |
| 2008/0206470 A1 | 8/2008 | Thomas et al. | |
| 2008/0213473 A1 | 9/2008 | Roisin et al. | |
| 2008/0276835 A1 | 11/2008 | Koyama et al. | |
| 2008/0318033 A1 | 12/2008 | Zultzke et al. | |
| 2010/0103523 A1* | 4/2010 | Fukui | G02B 1/115 359/581 |
| 2010/0104838 A1 | 4/2010 | Noguchi et al. | |
| 2010/0238557 A1 | 9/2010 | Tomoda | |
| 2012/0026456 A1 | 2/2012 | Nishimoto et al. | |
| 2012/0154916 A1 | 6/2012 | Nishimoto et al. | |
| 2012/0196215 A1 | 8/2012 | Nukada et al. | |
| 2014/0354945 A1 | 12/2014 | Martinu et al. | |
| 2015/0268384 A1 | 9/2015 | Tadokoro et al. | |

FOREIGN PATENT DOCUMENTS

| | | |
|---|---|---|
| CN | 101726767 A | 6/2010 |
| CN | 102565890 A | 7/2012 |
| EP | 2 833 167 A1 | 2/2015 |
| JP | 6-82862 A | 3/1994 |
| JP | 2006-65038 A | 3/2006 |
| JP | 2006-82862 A | 3/2006 |
| JP | 2007-127681 A | 5/2007 |
| JP | 2009-193022 A | 8/2009 |
| JP | 2010-102157 A | 5/2010 |
| JP | 2011-13654 A | 1/2011 |
| JP | 2011-17949 A | 1/2011 |
| JP | 2012-128135 A | 7/2012 |

OTHER PUBLICATIONS

International Preliminary Report on Patentability of Chapter II, dated Sep. 30, 2013.
Communication dated Nov. 12, 2015 from the State Intellectual Property Office of the P.R.C. in counterpart application No. 201380051097.2.
Communication dated Oct. 28, 2015 from the State Intellectual Property Office of the P.R.C. in related application No. 201380051034.7 (counterpart of U.S. Appl. No. 14/430,974).
Extended European Search Report issued in European Patent Application No. 13840846.3 dated Apr. 26, 2016, which corresponds to U.S. Appl. No. 14/430,974.
Chinese Office Action issued in corresponding Chinese Patent Application No. 201380051034.7 dated May 19, 2016, which corresponds to U.S. Appl. No. 14/430,974.
Extended European Search Report dated Jun. 20, 2016 issued in corresponding European Patent Application No. 13840626.9 dated Jun. 20, 2016.
Aug. 3, 2016 Office Action in related U.S. Appl. No. 14/430,974.
Chinese Office Action issued in corresponding Chinese Patent Application No. 201380051097.2 dated Aug. 23, 2016.
Office Action dated Feb. 14, 2017 in U.S. Appl. No. 14/430,974.
Australian Examination Report issued in corresponding Australian Patent Application No. 2013320853 dated Nov. 24, 2016 which corresponds to U.S. Appl. No. 14/430,974.
Australian Examination Report issued in corresponding Australian Patent Application No. 2013320854 dated Nov. 24, 2016.
Notice of Reasons for Refusal dated Aug. 1, 2017 issued in corresponding Japanese Application No. 2014-538677.
Office Action dated Jul. 31, 2017 in related U.S. Appl. No. 14/430,974.
Notice of Reasons for Refusal dated Aug. 1, 2017 issued in Japanese Application No. 2014-538676, which corresponds to U.S. Appl. No. 14/430,974.
PCT Written Opinion in PCT/JP2013/076600, dated Oct. 18, 2013. [PCT/ISA/237].
International Search Report for PCT/JP2013/076600, dated Oct. 29, 2013. [PCT/ISA/210].
International Preliminary Report of Patentability for PCT/JP2013/076600, dated Oct. 18, 2013. [PCT/IPEA/409].
Notice of Allowance dated Nov. 22, 2017 in related U.S. Appl. No. 14/430,974.
Office Action dated Apr. 10, 2018 issued in the corresponding Japanese patent application No. 2014-538677.
Office Action dated Apr. 10, 2018 issued in the Japanese patent application No. 2014-538676 which corresponds to U.S. Appl. No. 14/430,974.
Office Action dated Jun. 27, 2018 issued from the European Patent Office in the corresponding European Patent Application No. 13840626.9.
Office Action dated May 31, 2018 issued from the State Intellectual Property Office of P. R. China in Chinese Application No. 201611137703.4 which corresponds to U.S. Appl. No. 14/430,974.

* cited by examiner

EYEGLASS LENS HAVING IMPROVED HEAT RESISTANCE AND SCRATCH RESISTANCE

CROSS-REFERENCE TO RELATED APPLICATIONS

This application is a National Stage of International Application No. PCT/JP2013/076601 filed Sep. 30, 2013, claiming priority based on Japanese Patent Application No. 2012-217200 filed on Sep. 28, 2012 and Japanese Patent Application No. 2012-217204 filed on Sep. 28, 2012, all of which are expressly incorporated herein by reference in their entirety.

TECHNICAL FIELD

The present invention relates to an eyeglass lens, and more particularly, to an eyeglass lens having a vapor-deposited film that can exhibit good heat resistance (crack resistance) and scratch resistance.

BACKGROUND ART

Generally, eyeglass lenses are imparted with various properties by forming various functional films on the lens substrate while achieving a desired refractive index by means of the lens substrate. Antireflective films imparting an antireflective property to the lens surface are widely employed as such functional films. Among these, vapor-deposited films of zirconium (Zr) oxide are inexpensive among the high refractive index layers constituting multilayer antireflective films, and are thus considered advantageous in terms of cost (for example, see Japanese Unexamined Patent Publication (KOKAI) No. 2009-193022, which is expressly incorporated herein by reference in its entirety). Vapor-deposited films of tantalum (Ta) oxide can also function as high refractive index layers in the same way as vapor-deposited films of zirconium oxide.

Eyeglass lenses are required to have good durability that does not deteriorate even when placed in various environments. For example, eyeglass lenses are sometimes worn in the bath, left in automobiles in summer, and worn by wearers who are active for extended periods outdoors. There is a need for them to maintain good quality without developing cracks even when exposed to such elevated temperatures. In eyeglass lenses having vapor-deposited films of zirconium oxide and tantalum oxide, cracks may develop in the vapor-deposited films at elevated temperatures, resulting in phenomena such as a drop in optical characteristics and decreased adhesion between layers constituting the multilayer antireflective film.

Eyeglass lenses are also required to have good resistance to scratching without developing scratches or cracks with the application of external forces. Eyeglass lenses are subjected to various external forces in the course of removing fingerprints, debris, and other grime adhering to the lens surface. The scratches and cracks that develop due to such external forces cause phenomena such as decreased optical characteristics in the eyeglass lens and diminished adhesion between layers constituting multilayer antireflective films.

SUMMARY OF THE INVENTION

An aspect of the present invention provides for an eyeglass lens having a zirconium oxide or tantalum oxide vapor-deposited film and having good heat resistance (crack resistance) and scratch resistance.

The present inventors discovered the following previously unknown matters in the course of conducting extensive research into achieving the above eyeglass lens:

(1) The greater the uniformity in the planar TEM image of the above metal oxide vapor-deposited film, the better the heat resistance and the fewer cracks generated at elevated temperatures;

(2) The greater the uniformity in the planar TEM image of the above metal oxide vapor-deposited film, the greater the compressive stress, such that even when external forces were applied, forces counteracting them were produced, resulting in good scratch resistance and the generation of few scratches or cracks due to external forces.

(3) For the grains determined in the planar TEM image, since the presence of numerous small grains reduces uniformity, the larger the size (grain size) the higher the uniformity of the film.

The fact that the uniformity of the above planar TEM image is high and the grain size is large is an indicator of low anisotropy and high uniformity in the planar direction of the above vapor-deposited film. That is, the fact that decreasing the anisotropy and increasing the uniformity in the planar direction made it possible to increase the heat resistance and scratch resistance of the above vapor-deposited film was discovered by the present inventors.

Based on the above discoveries, the present inventors adopted the grain size and uniformity of the planar TEM image as new indicators and conducted repeated research by trial and error, varying the manufacturing conditions of the vapor-deposited film of the above metal oxide and the like. This resulted in the discovery that an oxide film of metal selected from the group consisting of zirconium and tantalum, having an average grain size of equal to or greater than 3.5 nm in a planar TEM image thereof and having a proportion accounted for by grain boundaries, which are boundaries separating grains from regions outside of the grains, of less than 15%, will have a high heat resistance and will not develop cracks (or develop few cracks) even when placed under high temperature, and will have good scratching resistance. The present invention was developed on that basis.

An aspect of the present invention relates to an eyeglass lens comprising a lens substrate and a vapor-deposited film either directly or indirectly on the lens substrate, wherein the vapor-deposited film is an oxide film of metal selected from the group consisting of zirconium and tantalum, with an average grain size observed in a planar image obtained by a transmission electron microscope of equal to or greater than 3.5 nm and a proportion accounted for by grain boundaries, which are boundaries separating grains from regions outside of the grains, in a planar image obtained by a transmission electron microscope of less than 15%.

In an embodiment, the proportion accounted for by regions observed in a streaky shape, in a columnar shape, or in a lump shape in a cross-sectional image of the vapor-deposited film obtained by a transmission electron microscope is less than 55%.

In an embodiment, the above vapor-deposited film is a zirconium oxide film.

In an embodiment, the above eyeglass lens comprises the above vapor-deposited film as at least one layer in a multilayer vapor-deposited film.

A further aspect of the present invention relates to a method of determining a manufacturing condition of an eyeglass lens comprising a vapor-deposited film that is an oxide film of metal selected from the group consisting of zirconium and tantalum, which comprises:

determining a candidate vapor deposition condition to be employed in vapor deposition of the vapor-deposited film in actual manufacturing;

forming a test vapor-deposited film by conducting vapor deposition under the candidate vapor deposition condition that has been determined; and taking at least one TEM image selected from the group consisting of a planar TEM image or a cross-sectional TEM image the test vapor-deposited film that has been formed and determining a vapor deposition condition of the vapor-deposited film in actual manufacturing, with a determination standard that the higher the uniformity of the TEM image, the more likely the candidate condition is to be a vapor deposition condition capable of forming a vapor-deposited film exhibiting good heat resistance or good scratch resistance, or good heat resistance and good scratch resistance.

In an embodiment, the uniformity is determined according to at least one determination standard selected from the group consisting of standards 1 to 4 below:

standard 1: in a cross-sectional TEM image, the lower the proportion accounted for by regions observed in a streaky shape, in a columnar shape, or in a lump shape, or the smaller the regions, the higher the uniformity is determined to be;

standard 2: the greater the area of dark portions obtained by binary processing of a cross-sectional TEM image obtained as a bright-field image, or the greater the area of the bright portions obtained by binary processing of a cross-sectional TEM image obtained as a dark-field image, the higher the uniformity is determined to be;

standard 3: the lower the proportion accounted for by grain boundaries in a planar TEM image, the higher the uniformity is determined to be; and standard 4: the greater the grain size observed in a planar TEM image, the higher the uniformity is determined to be.

A further aspect of the present invention relates to a method of manufacturing an eyeglass lens, which comprises:

determining a manufacturing condition by the method set forth above; and conducting vapor deposition under the manufacturing condition that has been determined to form a vapor-deposited film in the form of an oxide film of metal selected from the group consisting of zirconium and tantalum.

In an embodiment, the above vapor-deposited film is formed as a layer constituting a multilayer antireflective film.

An aspect of the present invention can provide an eyeglass lens having good durability in which the generation of cracks in the vapor-deposited film—which is an oxide film of metal selected from the group consisting of zirconium and tantalum—at high temperature and the occurrence of scratches and cracks due to external forces are inhibited.

MODES FOR CARRYING OUT THE INVENTION

Figure 1:
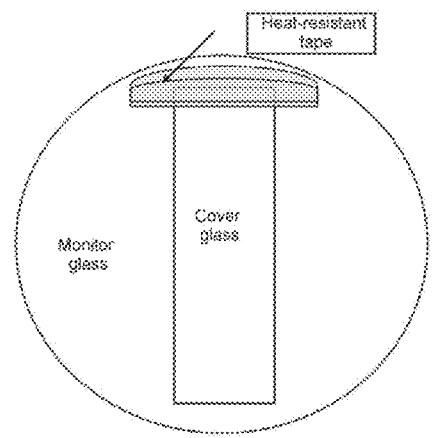
FIG. 1 A descriptive drawing of a method of measuring film stress.

An aspect of the present invention relates to an eyeglass lens comprising a lens substrate and a vapor-deposited film either directly or indirectly on the lens substrate, wherein the vapor-deposited film is an oxide film of metal selected from the group consisting of zirconium and tantalum, with an average grain size (referred to as the "average grain size", hereinafter) observed in a planar image obtained by a transmission electron microscope (planar TEM image) of equal to or greater than 3.5 nm and a proportion (referred to as the "grain boundary occupancy rate", hereinafter) accounted for by grain boundaries, which are boundaries separating grains from regions outside of the grains, in a planar image obtained by a transmission electron microscope of less than 15%. Eyeglass lenses in which no grains are observed, that is, with the oxide film of metal selected from the group consisting of zirconium and tantalum having a proportion accounted for by grain boundaries of 0%, are also included in the eyeglass lens according to an aspect of the present invention.

The eyeglass lens according to an aspect of the present invention will be described in greater detail below.

The eyeglass lens has a vapor-deposited film in the form of an oxide film of metal selected from the group consisting of zirconium and tantalum, either directly or indirectly on the lens substrate. The zirconium oxide film will be denoted as a "Zr oxide film" and the tantalum oxide film as a "Ta oxide film" hereinafter. The lens substrate is not specifically limited. Materials that are commonly employed as the lens substrates of eyeglass lenses, such as materials selected from among polyurethane, polythiourethane, polycarbonate, diethyleneglycol bisallylcarbonate, other plastics, and inorganic glass, can be employed. The thickness and diameter of the lens substrate are normally a thickness of about 1 to 30 mm and a diameter of about 50 to 100 mm, but there is no specific limitation.

As set forth above, Zr oxide films and Ta oxide films can function as high refractive index layers. They can be used to form a single layer on the lens substrate, or combined with layers of different refractive indexes, such as a low refractive index layer formed primarily of $SiO_2$ to form multilayer vapor-deposited films provided in the lens substrate. Such multilayer vapor-deposited films can further contain single-layer or two or more vapor-deposited films (also called "electrically conductive oxide layers") formed by vapor deposition using vapor deposition sources primarily comprised of an electrically conductive oxide. Providing such an electrically conductive oxide layer can prevent the adhesion of dust and debris on the lens surface. The electrically conductive oxide is desirably in the form of a known indium oxide, tin oxide, or zinc oxide, or some compound oxide thereof, that is known as a transparent electrically conductive oxide so as not to reduce the transparence of the eyeglass lens. From the perspective of transparence and electrical conductivity, a preferred example of an electrically conductive oxide is an indium-tin oxide (ITO). An embodiment of the multilayer vapor-deposited film is an antireflective film. However, there is no limitation to antireflective films. Any such layer that functions as a reflecting layer (cutting layer) performing the function of reducing the amount of light entering the eye of the eyeglass wearer by selectively reflecting light of a prescribed wavelength range will do. An example of light that is desirably reflected is ultraviolet light. The short wavelength light known as blue light that is emitted by the liquid crystal monitors that have become widespread in recent years, particularly the light emitted at a wavelength of roughly 400 nm to 500 nm by LED liquid-crystal monitors, is another example.

The thickness of the Zr oxide or Ta oxide film can be a physical film thickness of about 10 to 100 nm, for example. It suffices to determine the film thickness based on the function (antireflective property or the like) that is required of the film; there is no specific limitation. The film thicknesses given below refer to physical film thicknesses.

The eyeglass lens according to an aspect of the present invention comprises one or more layers of Zr oxide film or Ta oxide film on a lens substrate. These oxide films can be optionally combined into two or more layers. At least one layer of Zr oxide film or Ta oxide film is a vapor-deposited film with an average grain size observed in a planar TEM image of equal to or greater than 3.5 nm and a proportion (grain boundary occupancy rate) accounted for by grain boundaries, which are boundaries separating grains from regions outside of the grains, in a planar image obtained by a transmission electron microscope of less than 15%. The planar TEM image is obtained by observing the vapor-deposited film that is the subject of observation by a transmission electron microscope (TEM) in a direction that is perpendicular to, or approximately perpendicular to, the direction of thickness. By contrast, the method of observation in a direction that is parallel or approximately parallel to the direction of thickness is cross-sectional TEM observation. This point will be described further below. Through research, the present inventors discovered that the higher the uniformity of the planar TEM image, the greater the heat resistance (crack resistance) and scratch resistance. The grain boundary occupancy rate and the average grain size observed in the planar TEM image is adopted as an indicator of uniformity in an aspect of the present invention. Based on investigation conducted by the present inventors, in elemental analysis conducted by TEM-EDS, for example, no clear difference was observed between films with different heat resistance (crack resistance) and scratch resistance for Zr oxide films and Ta oxide films. Thus, the specific correlation between the heat resistance (crack resistance) and scratch resistance of Zr oxide films and Ta oxide films of different uniformity in their planar TEM images was discovered by the present inventors. The planar TEM image is obtained in the present invention by known methods in which a transmission electron microscope is employed.

In the above Zr oxide film and Ta oxide film, the average grain size observed in the planar image (planar TEM image) obtained by a transmission electron microscope is equal to or greater than 3.5 nm as stated above, desirably equal to or greater than 5 nm, preferably equal to or greater than 5.5 nm, and yet more preferably, equal to or greater than 5.8 nm. The average size is, for example, equal to or less than 20 nm, but the larger the grain size the better, since the presence of multiple minute grains decreases the uniformity of the film. The proportion accounted for in the planar TEM image by grain boundaries separating grains from regions outside of the grains is less than 15% as set forth above, desirably equal to or less than 10%, preferably equal to or less than 5%, and more preferably, equal to or less than 3%. The smaller, the better.

The grains that are observed in the planar TEM image are observed as regions that are enclosed by grain boundaries and thus separated from other regions in a planar TEM image obtained at a magnification of 50,000 to 400,000-fold. The grain boundaries can be identified by differences in shading in the TEM image. The proportion of the entire area of the observed field that is accounted for by grain boundaries falls within the range stated above. The observed field can be set to permit clear determination of the separation of the grains from the regions outside of the grains by means of grain boundaries, based on the size of grains observed in the planar TEM image. The observed field can be set to a range, for example, of 50 nm square (50 nm×50 nm) to 150 nm square (150 nm×150 nm). For example, an observed field at a magnification of 100,000 to 200,000-fold can be set to 100 nm square (100 nm×100 nm) to 150 nm square (150 nm×150 nm), and an observed field exceeding a magnification of 200,000-fold can be set to 50 nm square (50 nm×50 nm) to 100 nm square (100 nm×100 nm). The observation position is desirably changed to obtain TEM images at five or more spots (for example, 5 to 10 spots), and grain boundary occupancy rates are desirably obtained as the arithmetic average value of the measurement values obtained from the various TEM images.

The planar TEM image can be obtained as a bright-field image or as a dark-field image. From the perspective of ease of analysis, it is desirable to obtain a planar TEM image in the form of a dark-field image when microcrystals are contained. Conversely, it is desirable to obtain the planar TEM image in the form of a bright-field image when considerable amorphous materials are present.

The grains that are observed in the planar TEM image are distinguished from other regions by the grain boundaries, and are primarily regions determined to be granular or in a cluster shape, but can also be of indeterminate shape. Examples of the specific structures of the grains are structures within which crystalline grains are present in the grains. The grains can contain one or both of crystals and amorphous materials. The presence of crystals can be determined by observing the crystal lattice. The average grain size in the planar TEM image that is referred to can be either a value that is calculated by measuring the major axis and minor axis of each region distinguished as another region by the grain boundaries in the observed field, calculating the average value of the major axes and the average value of the minor axes of the lump regions contained in the observed field, and adopting the value obtained by calculating (major axis average value+minor axis average value)/2. Alternatively, the diameter of a circle having the same area as each of the regions, that is, the equivalent circle diameter, is calculated for the grains that are contained in the observed field, and the average value is adopted as the average grain size. Grains with portions that protrude from the image are not measured. The average value is the arithmetic average. When numerous grains are observed, the area of the observed field can be changed to contain 50 or more (desirably 100 or more) grains, for example. When indeterminate grains are contained, in cases where their shapes are small or their crystallinity is high, the observation region can be expanded (for example, a 100,000-fold field can be expanded to a 200% image) and compared with results obtained from an observation image that has been separately observed at high magnification (for example, 200,000-fold, 250,000-fold, or 400,000-fold). When the value of the results of comparison differs by 1 nm or more, the average value is desirably adopted. The average grain size is desirably measured at five or more spots (for example, 5 to 10 spots) by changing the observation position and obtaining an average value, as set forth above for the grain boundary occupancy rate.

Reference can be made to JIS R 1670: 2006 for measurement of the average grain size set forth above.

In a desirable embodiment, in the Zr oxide film and Ta oxide film, the proportion accounted for by regions observed in a streaky shape, in a columnar shape, or in a lump shape in a cross-sectional image (cross-sectional TEM image) obtained by a transmission electron microscope is less than 55%, preferably equal to or less than 40%, more preferably equal to or less than 30%, still more preferably equal to or less than 15%, yet more preferably equal to or less than 10%, and yet still more preferably equal to or less than 5%. The proportion accounted for by regions in a lump shape is desirably small.

The above regions observed in the cross-sectional TEM image are observed as regions distinguished from the other regions by different shades in a cross-sectional TEM image obtained at a magnification of 50,000 to 400,000-fold. Normally, these regions are observed with a nonuniform, marbled structure in a cross-sectional TEM image. The proportion accounted for by these regions is desirably obtained by changing the observation position and calculating the arithmetic average values of five or more spots (for example, 5 to 10 spots), as set forth above for the observation of the planar TEM image. The details of obtaining and analyzing cross-sectional TEM images are identical to those set forth regarding the planar TEM images above.

The cross-sectional TEM image can be obtained as a bright-field image or as a dark-field image. From the perspective of facilitating analysis, the cross-sectional TEM image is desirably obtained in the form of a dark-field image for those containing microcrystals. On the other hand, when considerable amorphous materials are present, the cross-sectional TEM image is desirably obtained as a bright-field image.

The above regions observed in the cross-sectional TEM image are, as set forth above, observed in a streaky shape, in a columnar shape, or in a lump shape, and may be indeterminate forms. Examples of specific structures that can be contained in these regions are columnar structures and crystalline grains. Columnar structures are mainly determined in a direction normal to, or approximately normal to, the surface of the lens substrate (base material). Crystalline grains are mainly determined as grains or in a state in which they are arranged in columns in a direction normal to, or approximately normal to, the lens substrate. The term "in a direction approximately normal to" is used to mean including directions inclined by about ±20° when the normal direction is denoted as 0°. Columnar structures and crystalline grains may include amorphous materials in addition to crystals. The incorporation of crystals can be determined by the observation of the crystal lattice in the TEM image.

Desirably, the above-described Zr oxide film can be formed by vapor deposition of a vapor deposition source the primary component of which is $ZrO_2$ and the Ta oxide film can be formed by vapor deposition of a vapor deposition source the primary component of which is $Ta_2O_5$. In an aspect of the present invention, the "primary component" refers to the component accounting for the greatest portion of the vapor deposition source or the vapor deposition layer. This component normally accounts for about 50 mass percent to 100 mass percent of the total, even about 90 mass percent to 100 mass percent. Impurities that inevitably mix in trace amounts will sometimes be contained in the vapor deposition source. Other components can be contained in ranges that do not compromise functioning of the primary component, such as other inorganic substances and known additive components that play assisting roles in vapor deposition. Vapor deposition can be conducted by vacuum vapor deposition, ion plating, plasma CVD, the ion-assisted method, reactive sputtering, or the like. The ion-assisted method is desirable for obtaining good adhesion.

For example, in the ion-assisted method, it is possible to control the physical properties of the vapor-deposited film that is formed by means of the vapor deposition conditions, such as the degree of vacuum, acceleration voltage, acceleration current, assist gas (ionized gas) flow rate and blending ratio during vapor deposition, as well as the composition and the like of the vapor deposition source employed. In an embodiment of the present invention, the vapor deposition conditions can be determined by conducting preliminary testing as needed to form the above Zr oxide film and Ta oxide film.

In the field of manufacturing eyeglass lenses, to stably provide eyeglass lenses of a quality that does not decrease over time, prior to determining the conditions used in actual manufacturing, it is common practice to conduct accelerated durability testing on test sample eyeglass lenses that have been fabricated using candidate manufacturing conditions and adopt, in actual manufacturing, manufacturing conditions that are identical to the manufacturing conditions of the test sample eyeglass lenses that have exhibited good test results. For example, by forming vapor-deposited films in actual manufacturing under manufacturing conditions that have yielded test sample eyeglass lenses with few cracks in accelerated durability testing by oven heating, it is possible to obtain eyeglass lenses exhibiting good durability without undergoing deterioration of the vapor-deposited film over extended periods of actual use.

Further, to stably provide high-quality eyeglass lenses, prior to determining conditions for actual manufacturing, it is common practice to conduct performance evaluation tests on test sample eyeglass lenses fabricated under candidate manufacturing conditions and adopt manufacturing conditions identical to the manufacturing conditions of test sample eyeglass lenses exhibiting good test results in actual manufacturing. For scratch resistance, by forming vapor-deposited films in actual manufacturing by manufacturing conditions that have yielded test sample eyeglass lenses producing few cracks in scratch tests in which loads are placed on steel wool or a sand eraser, for example, it is possible to obtain eyeglass lenses exhibiting good durability with little scratch or crack generation in actual use.

Although the above accelerated durability test has become indispensable to providing eyeglass lenses exhibiting good durability for extended periods and with high reliability, in order to manufacture eyeglass lenses that currently pass accelerated durability tests, candidate vapor deposition conditions are determined for manufacturing product eyeglass lenses, eyeglass lenses are fabricated by forming vapor deposition films under the vapor deposition conditions that have been determined, and the eyeglass lenses that have been fabricated are subjected to accelerated durability testing. When the evaluation standards are not satisfied, new candidate vapor deposition conditions are selected and the series of steps are repeated in a process of trial and error. Even though the scratch resistance test employing test sample eyeglass lenses set forth above has become indispensable for providing eyeglass lenses exhibiting good scratch resistance over extended periods with high reliability, in order to manufacture eyeglass lenses that currently pass scratch resistance tests, candidate vapor deposition conditions are determined for manufacturing product eyeglass lenses, eyeglass lenses are fabricated by forming vapor deposition films under the vapor deposition conditions that have been determined, and the eyeglass lenses that have been fabricated are subjected to scratch resistance testing. When the evaluation standards are not satisfied, new candidate vapor deposition conditions are selected and the series of steps are repeated in a process of trial and error.

By contrast, by conducting evaluation based on a TEM image selected from the group consisting of the planar TEM image and the cross-sectional TEM image in the manner discovered by the present inventors, manufacturing conditions for Zr oxide films and Ta oxide films, in which the generation under high temperatures can be inhibited and good scratch resistance can be achieved, can be readily discovered.

In an embodiment, candidate vapor deposition conditions for a vapor-deposited film are first determined for the manufacturing of a product lens. For example, when using the ion-assisted method in actual manufacturing, the above various conditions are determined. When using some other vapor deposition method, the various conditions relating to that vapor deposition method are determined.

Next, vapor deposition is conducted under the vapor deposition conditions that have been determined as set forth above and a test vapor deposition film is fabricated. The test vapor deposition film can be formed on the lens substrate or on the surface of a functional film on the lens substrate in the same manner as in actual manufacturing, or formed on a test substrate of glass or the like. From the perspective of ease of TEM observation, it is desirable to fabricate the test vapor deposition film on a glass substrate.

The test vapor deposition film fabricated as set forth above is observed by TEM selected from the group consisting of planar TEM observation and cross-sectional TEM observation. The details of the TEM observation are as set forth above.

In determining the uniformity of a cross-sectional TEM image, for example, cross-sectional TEM images are visually compared. Images in which marbled nonuniform structures are found are determined to poor uniformity and images in which such structures are not found are determined to be highly uniform.

Uniformity can be determined based on standard 1, standard 2, or standards 1 and 2 below.

Standard 1: in a cross-sectional TEM image, the lower the proportion accounted for by regions observed in a streaky shape, in a columnar shape, or in a lump shape, or the smaller the regions, the higher the uniformity is determined to be.

Standard 2: the greater the area of dark portions obtained by binary processing of a cross-sectional TEM image obtained as a bright-field image, or the greater the area of the bright portions obtained by binary processing of a cross-sectional TEM image obtained as a dark-field image, the higher the uniformity is determined to be.

As an example of the regions observed in a streaky shape, in a columnar shape, or in a lump shape in evaluation by standard 1, in a cross-sectional TEM image obtained at a magnification of 150,000-fold, the region the major diameter (major axis length) of which based on differences in shading is equal to or greater than 1 nm as an actual size is identified as the above region, and the presence of such regions can be determined. The size of the above regions can be determined manually by a person or determined automatically by software analysis. For example, the determination of standard 1 can be conducted based on the major axis length and minor axis length of one or more such regions (with a columnar structure, for example) in a cross-sectional TEM image, or based on the average value of the size of multiple such regions.

The binary processing of standard 2 can be conducted in the manner below, for example.

The brightness of each pixel (picture element) of a cross-sectional TEM image that has been obtained and the average brightness of the entire image are obtained. The ratio of the number of pixels that are brighter than the average relative to the entire number of pixels is adopted as the area fraction of the bright portion, and the ratio of the number of pixels that are darker than the average relative to the entire number of pixels is adopted as the area fraction of the dark portion, and the area of the bright portion and the dark portion can be obtained. More specifically, the gradation of each pixel is obtained for a common digital image file (gray scale, for example, 256 gradations), a histogram is prepared from the number of pixels and the gradation, and the average gradation of the image as a whole is obtained. Binary processing is conducted with the average gradation as a threshold, with pixels with gradations (bright) greater than or equal to the threshold being assigned the value 1 and pixels with gradations (dark) below the threshold being assigned the value 0. For the entire number of pixels, the number of pixels with a value of 1 is calculated, and this number is adopted as the bright area fraction.

Such binary processing can be automatically carried out with known analysis software.

The uniformity of a planar TEM image can be determined by, for example, comparing the analysis results of planar TEM images visually or with analysis software, determining that those images in which the proportion accounted for by grain boundaries is large are of poor uniformity, and determining that those images in which this proportion is small are of high uniformity (standard 3). The larger the grain size observed in a planar TEM image, the higher the uniformity is determined to be (standard 4). The grain size used in making the determination can be measured manually by a person or automatically with analysis software.

As set forth further below, the difference in uniformity of TEM images determined as set forth above correlates with the heat resistance (crack resistance) of the vapor-deposited film. The present inventors have confirmed that the higher the uniformity, the less cracking occurs at elevated temperatures. Accordingly, in an embodiment, the vapor deposition conditions of the vapor-deposited film in actual manufacturing are determined based on a standard of determining that candidate conditions of high uniformity in a TEM image are vapor deposition conditions permitting the formation of a vapor-deposited film exhibiting good heat resistance.

As set forth further below, the present inventors have confirmed that the difference in uniformity of TEM images determined as set forth above correlates with the magnitude of compressive stress on the vapor-deposited film. The higher the uniformity, the greater the compressive stress, such that even when external forces are applied, a force counteracting them is generated, resulting in good scratch resistance. Accordingly, in an embodiment, the vapor deposition conditions for the vapor-deposited film in actual manufacturing are determined based on a standard of determining that candidate conditions of high uniformity in a TEM image are vapor deposition conditions that permit the formation of a vapor-deposited film exhibiting good scratch resistance.

For example, in a specific implementation mode, it is possible to determine actual manufacturing conditions based on a relative determination of adopting vapor deposition conditions for a vapor-deposited film in actual manufacturing in the form of the conditions with the highest uniformity in their TEM images among two or more sets of candidate conditions.

Further, in another specific implementation mode, preliminary testing is conducted, and a data base is created of correlations between vapor deposition conditions of vapor-deposited films and the tendency for cracks to develop at high temperature and the tendency for scratches and cracks to develop due to external forces. Based on the data base, a uniformity threshold (critical value) permitting the formation of vapor-deposited films with good heat resistance and scratch resistance is set. Films having uniformity higher than or equal to the threshold can then be used to determine the vapor deposition conditions of vapor-deposited films in actual manufacturing. The grain size or grain boundary occupancy rate in a planar TEM image, the bright portion or dark portion area fraction obtained by binary processing in a cross-sectional TEM image, the major axis length or minor axis length of the above regions, or the like can be employed as the threshold.

For example, for a cross-sectional TEM image, the area fraction of the dark portion in a bright-field image, or the area fraction of the bright portion in a dark-field image, can be set to equal to or greater than 90%, even equal to or greater than 95%, of the entire analysis region as a uniformity determination standard permitting the formation of vapor-deposited films with good heat resistance. A major axis length of equal to or less than 5 nm and a minor axis length of equal to or less than 1 nm as the actual size of the above region observed in a cross-sectional TEM image obtained at a magnification of 150,000-fold can be made a uniformity determination standard permitting the formation of vapor-deposited films of good heat resistance.

In yet another specific implementation mode, vapor deposition conditions, that have been changed (by changing the degree of vacuum, for example) so as not to affect the heat resistance or to increase the heat resistance from candidate vapor deposition conditions determined to permit the formation of a vapor-deposited film of good heat resistance and scratch resistance based on the above relative determination results or the determination results based on the threshold, can be adopted as the vapor deposition conditions in actual manufacturing.

It is possible to obtain an eyeglass lens having a Zr oxide film or a Ta oxide film exhibiting good heat resistance and scratch resistance without having to go through the trial and error of accelerated durability testing or scratch resistance testing using test sample eyeglass lenses by determining the vapor deposition conditions of the vapor-deposited film in actual manufacturing based on the uniformity observed in a TEM image.

A further aspect of the present invention provides a method of manufacturing an eyeglass lens comprising determining the manufacturing condition by the above manufacturing condition determination method, and conducting vapor deposition based on the manufacturing condition that have been determined to form a vapor-deposited film in the form of an oxide film of metal selected from the group consisting of zirconium and tantalum.

As set forth above, it is possible to determine vapor deposition conditions permitting the forming of a Zr oxide film or Ta oxide film having good heat resistance (crack resistance) and scratch resistance by the above method of determining the manufacturing condition. Thus, it is possible to manufacture an eyeglass lens having a Zr oxide film or a Ta oxide film exhibiting good durability in which the generation of cracks at elevated temperature as well as the generation of scratches and cracks due to external forces have been inhibited by forming the vapor-deposited film based on the manufacturing condition determined by this method.

The above vapor-deposited film or a multilayer vapor-deposited film containing it can be formed directly on a lens substrate or can be formed over a functional film such as a hard coat layer provided on the lens substrate. With the exception of conducting vapor deposition under the film-forming condition permitting the formation of the above-described Zr oxide film or Ta oxide film, known techniques can be applied without limitation to manufacture the eyeglass lens according to an aspect of the present invention.

EXAMPLES

The present invention will be described below based on Examples. However, the present invention is not limited to the embodiments given in Examples. The vapor deposition sources consisting of, without consideration of impurities that might be potentially, or inevitably, mixed in, oxides that have been described were used below.

Examples 1 to 4

A $ZrO_2$ vapor-deposited film was formed on one side of a lens substrate (HL made by HOYA Corp., refractive index 1.50) in a vapor deposition device at a vacuum of 4.3E-3 Pa using $ZrO_2$ as the vapor deposition source by an ion-assisted method while introducing a 20 sccm quantity of $O_2$ or a mixed gas of $O_2/Ar$ as the assist gas. In each of Examples and Comparative Examples, the ion gun conditions were varied between electric currents of 100 to 300 mA and voltages of 100 to 500 V. The film thickness calculated based on the film formation conditions was about 70 nm. The current and voltage of the ion gun were set in the following sequence, in decreasing order: Example 1>Example 2>Example 3>Example 4.

Comparative Example 1

With the exception that vapor deposition was conducted without an ion assist, a $ZrO_2$ vapor-deposited film was formed in the same manner as that set forth above.

In the various Examples and Comparative Example, multiple eyeglass lenses were fabricated as samples for the following evaluation.

<Evaluation Methods>

1. Proportion Accounted for by Grain Boundaries Observed in Planar TEM Images

A portion of the lens substrate was shaved down by etching by ion milling from the rear side relative to the side on which the $ZrO_2$ vapor-deposited film had been formed. The etching was halted when the $ZrO_2$ vapor-deposited film had been shaved down to a thickness of about 20 nm. The sample thus fabricated was introduced into a transmission electron microscope and a planar TEM image (dark-field image) was obtained at a magnification of 100,000-fold. Planar TEM images were obtained in five spots by varying the position with an observed field of 150 nm×150 nm. For each Example and Comparative Example, the proportion of the total area of the observed field accounted for by grain boundaries was calculated with commercial analysis software, and the arithmetic average of the values calculated for the five spots was calculated as the proportion accounted for by grain boundaries.

2. Average Grain Size Observed in Planar TEM Image

The average grain size in the planar TEM images obtained in 1. above was obtained by the method set forth above.

3. Proportion Accounted for by Regions Observed in a Streaky Shape, in a Columnar Shape, or in a Lump Shape in Cross-Sectional TEM Image A sample was cut out of the $ZrO_2$ vapor-deposited film in a sectional direction for each of the $ZrO_2$ vapor-deposited films fabricated in Examples and Comparative Example, etching by ion milling was used to shave down the $ZrO_2$ vapor-deposited film in the sectional direction, and the etching was ended when the thickness of the $ZrO_2$ vapor-deposited film had been shaved down to about 100 nm. The sample thus fabricated was introduced into a transmission electron microscope and a cross-sectional TEM image (bright-field image) was obtained at a magnification of 150,000-fold. Cross-sectional TEM images were obtained in five spots by changing the position with an observed field of 100 nm×100 nm. For each Example and Comparative Example, the proportion of the total area of the observed field accounted for by regions observed in a streaky shape, in a columnar shape, or in a lump shape (regions distinguished from other regions by differences in shading, primarily in which marbling was observed) was calculated by commercial analysis software. The arithmetic average of the values calculated for five spots were adopted as the proportion accounted for by the above regions.

4. Evaluation of Heat Resistance

The eyeglass lenses fabricated in Examples and Comparative Examples were placed for two hours in a heating furnace at internal furnace temperatures of 75° C., 80° C., 90° C., and 100° C., observed under fluorescent lamps for the presence of cracks of several cm or more in length in the vapor-deposited film, and evaluated for heat resistance on the following scale:

A: No cracks observed at any temperature;
B: Cracks observed at 100° C., but no cracks observed at 75° C., 80° C. or 90° C.;
C: Cracks observed at 90° C. and 100° C., but no cracks observed at 75° C. or 80° C.;
D: Cracks observed at 80° C., but no cracks observed at 75° C.;
E: Cracks observed at all temperatures.

5. Evaluation of Scratch Resistance

A water-repellent layer in the form of a fluorine-substituted alkyl group-comprising organic silicon compound made by Shin-Etsu Chemical Co., Ltd., KY130, was employed as vapor deposition source and vapor deposition was conducted by halogen heating on each of the vapor-deposited films of the eyeglass lenses fabricated in Examples and Comparative Examples to fabricate samples.

The samples that had been fabricated were subjected to a scratch resistance test in which steel wool was run back and forth 20 times under a load of 1 kg, 2 kg or 3 kg. The vapor-deposited film was observed under a fluorescent lamp following the scratch resistance test, the presence of scratches and cracks 5 mm or greater in length was checked for, and the scratch resistance was evaluated on the following scale:

A: No scratches or cracks found at loads of 1 kg, 2 kg or 3 kg;
B: Scratches or cracks found at a load of 3 kg but no scratches or cracks found at a load of 1 kg or 2 kg;
C: Scratches or cracks found at a load of 2 kg and 3 kg but no scratches or cracks found at a load of 1 kg;
D: Scratches and cracks observed at loads of 1 kg, 2 kg and 3 kg, with the number of scratches and cracks being equal to less than 5 but equal to or more than 2;
D: Scratches and cracks observed at loads of 1 kg, 2 kg and 3 kg, with the number of scratches and cracks being equal to or more than 6.

6. Evaluation of Film Stress

Heat resistance tape measuring 5 to 8 mm×30 to 40 mm in size was adhered to the surface of a piece of round platelike monitor glass (70 mm in diameter) that had been cleaned in a cleaning apparatus. As indicated in the schematic of FIG. 1, a platelike cover glass (also referred to as the "substrate" hereinafter) was placed on the surface of the monitor glass. To prevent adhesion to the monitor glass, one edge was disposed on the above heat-resistant tape, after which the edge portion of the cover glass was secured with heat resistant tape. The monitor glass with cover glass was placed in a vapor deposition device, and under the same conditions as in the various Examples and Comparative Examples, a $ZrO_2$ vapor-deposited film was formed on the surface of the cover glass.

Figure 2:
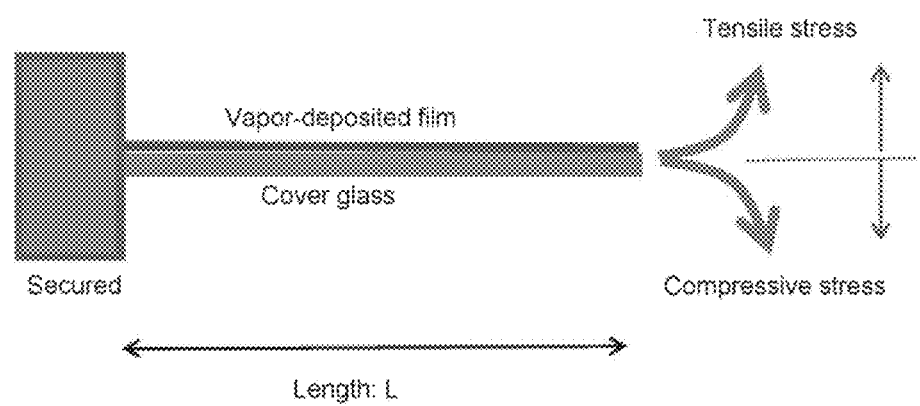
FIG. 2 A descriptive drawing of a method of measuring film stress.

Following film formation, the cover glass was removed from the monitor glass, and with one edge secured as shown in FIG. 2, the amount of displacement from the horizontal surface was measured. The Stoney equation, indicated below, was used to obtain the film stress σ. Negative values indicate compressive stress while positive values indicate tensile stress.

$$\sigma = \frac{Es \cdot ts^2 \cdot d}{3(1 - vs) \cdot L^2 \cdot tf}$$

In the equation, Es: Young's modulus of substrate; ts: thickness of substrate; vs: Poisson ratio of substrate; L: length of substrate; tf: thickness of vapor-deposited film; d: amount of displacement Table 1 gives the results of the above.

TABLE 1

| | Cross-sectional TEM image Proportion accounted for by regions observed in a streaky shape, in a columnar shape, or in a lump shape | Planar TEM image Proportion accounted for by grain boundaries | Average grain size (nm) | Evaluation results | | Film stress (MPa) |
|---|---|---|---|---|---|---|
| | | | | Heat resistance | Scratch resistance | |
| Ex. 1 | 2 | 1 | 11.5 | A | A | −200 |
| Ex. 2 | 10 | 3 | 8.2 | B | A | −100 |
| Ex. 3 | 15 | 5 | 5.8 | C | B | 50 |
| Ex. 4 | 30 | 10 | 3.5 | D | C | 100 |
| Comp. Ex. 1 | 55 | 15 | 3.1 | E | E | 150 |

Based on the results shown in Table 1, an aspect of the present invention can be determined to provide eyeglass lenses having a Zr oxide film with high heat resistance withstanding high temperatures and good scratch resistance.

In the above Examples, embodiments are shown in which zirconium has been adopted as the metal constituting the oxide. However, tantalum is metal that is known to permit the formation of oxide films of identical or similar film properties to those of zirconium oxide films. Accordingly, an aspect of the present invention can provide eyeglass lenses with Ta oxide films having high heat resistance and good scratch resistance.

No crystal lattices were found in the planar TEM images obtained at magnifications of 400,000-fold of the vapor-deposited films prepared in Examples 1 to 3. By contrast, a slight crystal lattice was found in Example 4 and an extensive crystal lattice was found in Comparative Example 1.

Figure 3:
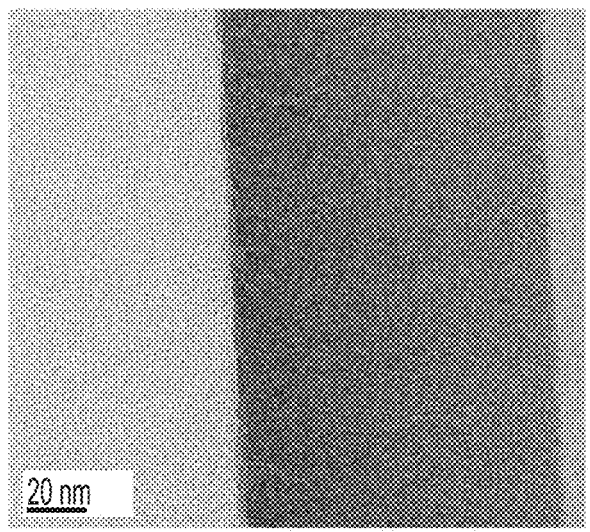
FIG. 3 is a cross-sectional TEM image obtained for Example 1.
Figure 4:
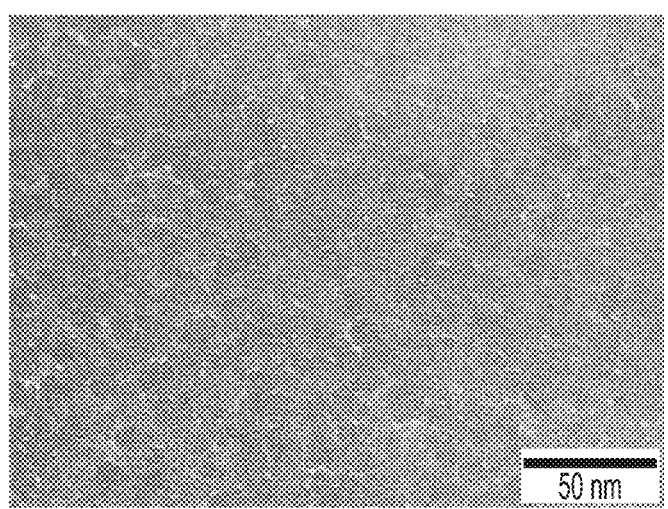
FIG. 4 is a planar TEM image obtained for Example 1.

FIG. 3 is a cross-sectional TEM image obtained in the evaluation of Example 1. FIG. 4 is a planar TEM image obtained for Example 1.

Figure 5:
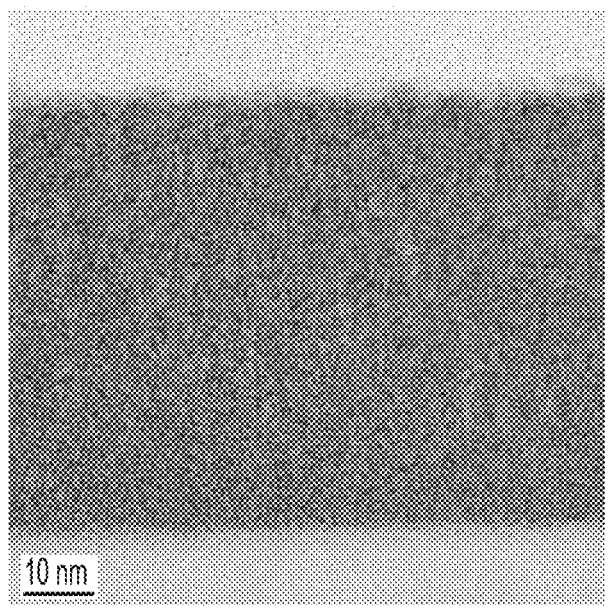
FIG. 5 is a cross-sectional TEM image obtained for Example 2.
Figure 6:
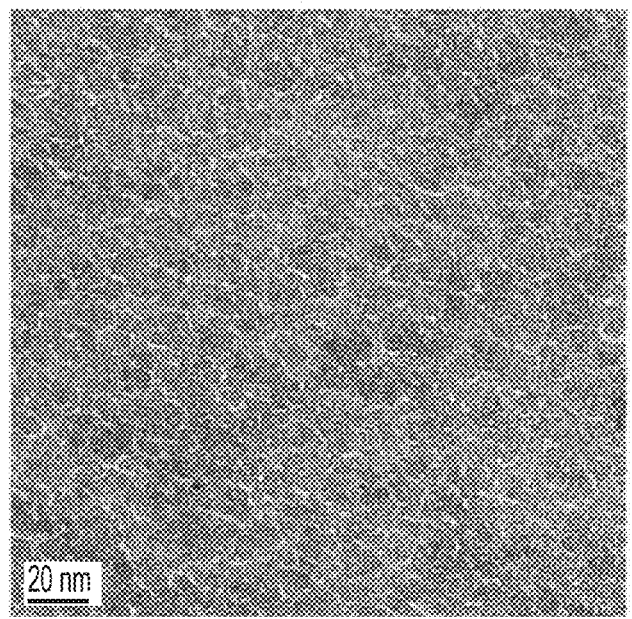
FIG. 6 is a planar TEM image obtained for Example 2.

FIG. 5 is a cross-sectional TEM image obtained in the evaluation of Example 2. FIG. 6 is a planar TEM image obtained for Example 2.

Figure 7:
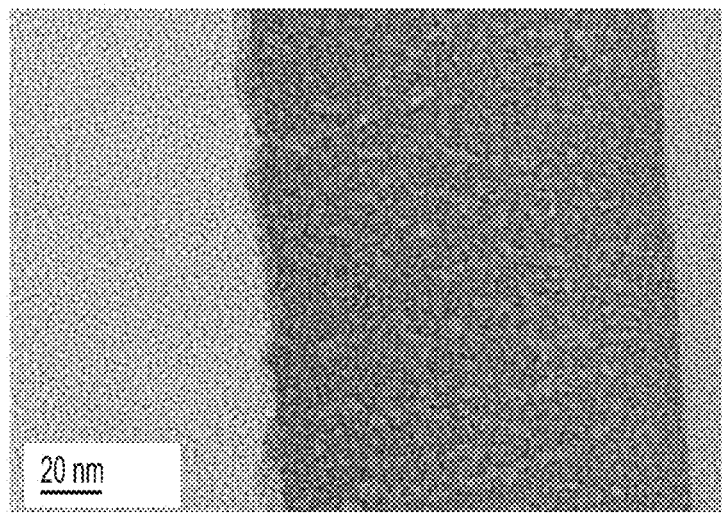
FIG. 7 is a cross-sectional TEM image obtained for Example 3.
Figure 8:
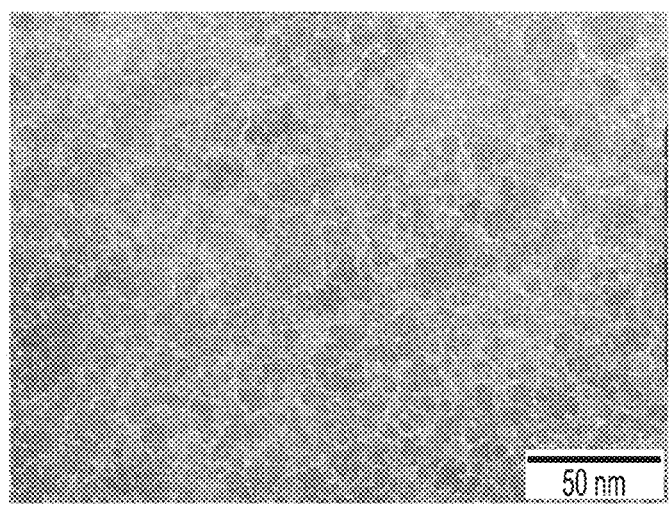
FIG. 8 is a planar TEM image obtained for Example 3.

FIG. 7 is a cross-sectional TEM image obtained in the evaluation of Example 3. FIG. 8 is a planar TEM image obtained for Example 3.

Figure 9:
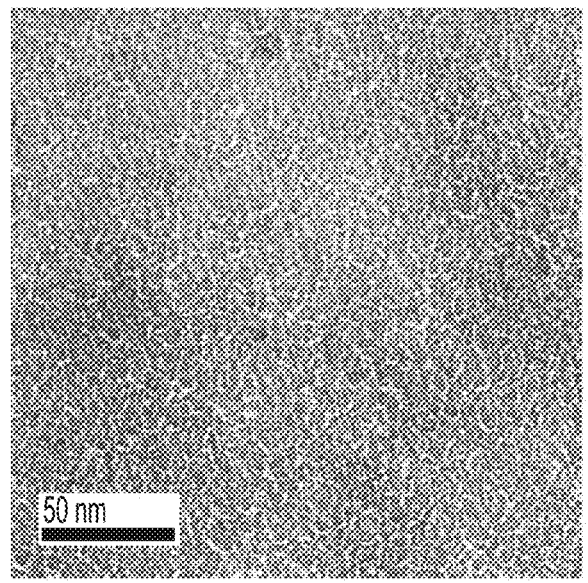
FIG. 9 is a planar TEM image obtained for Example 4.

FIG. 9 is a planar TEM image obtained in the evaluation of Example 4.

Figure 10:
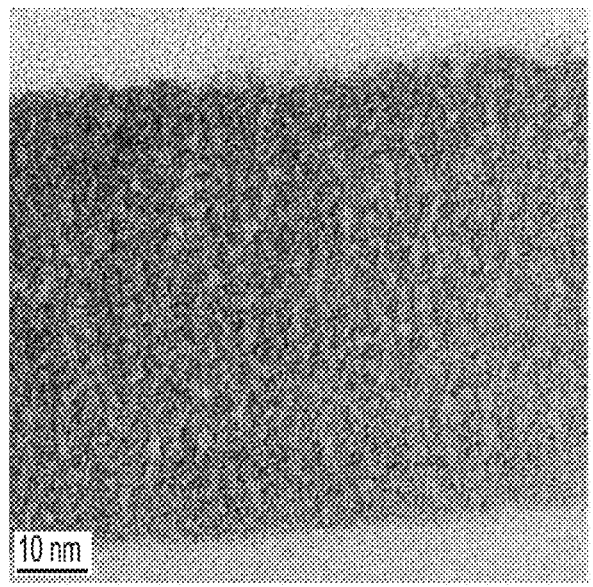
FIG. 10 is a cross-sectional TEM image obtained for Comparative Example 1.
Figure 11:
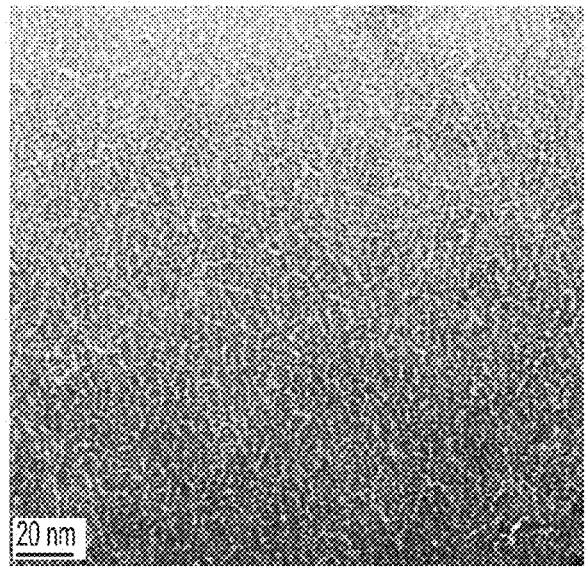
FIG. 11 is a planar TEM image obtained for Comparative Example 2.

FIG. 10 is a cross-sectional planar TEM image obtained in the evaluation of Comparative Example 1. FIG. 11 is a planar TEM image obtained for Comparative Example 1.

Figure 12:
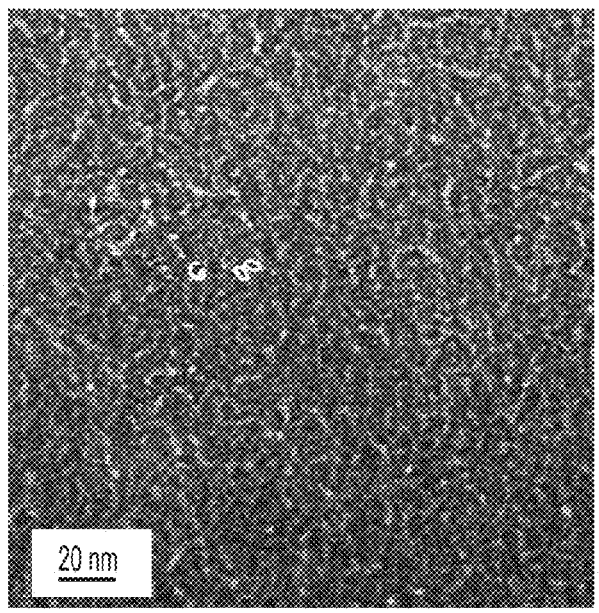
FIG. 12 is a partial enlargement within a frame of the grain of the planar TEM image shown in FIG. 11.

FIG. 12 is an enlarged view of the planar TEM image shown in FIG. 11 with some of the grains in a frame.

A comparison of the drawings clearly reveals that the vapor-deposited films fabricated in Comparative Example was less uniform than the vapor-deposited films fabricated in Examples.

[Specific Embodiments Relating to Determining Manufacturing Conditions]

1. Determining Candidate Vapor Deposition Conditions

Using $ZrO_2$ as a vapor deposition source, $ZrO_2$ vapor-deposited films were formed to film thicknesses of about 70 nm by an ion-assisted method under varying ion-assisted conditions (condition 1, condition 2) on glass substrates. The current and voltage of the ion gun were set higher in condition 2 than in condition 1.

2. Evaluation of Uniformity of TEM Image

For each of the $ZrO_2$ vapor-deposited films fabricated by vapor deposition under condition 1 in 1. above and the $ZrO_2$ vapor-deposited films fabricated by vapor deposition under condition 2, a piece of dummy glass was adhered with an adhesive to the $ZrO_2$ vapor-deposited film from above and a sample was cut in the sectional direction of the $ZrO_2$ vapor-deposited film. Etching by ion milling was used to shave down the $ZrO_2$ vapor-deposited film in the sectional direction. The etching was stopped when the thickness of the $ZrO_2$ vapor-deposited film reached about 100 nm. The sample thus fabricated was placed in a transmission electron microscope and a cross-sectional image (bright-field image) was obtained at a magnification of 150,000-fold.

For each cross-sectional TEM image, commercial analysis software was used to binary process the shade of a region 130 nm×130 nm in area and the area fractions of the dark portions and bright portions were obtained. As a result, the value of the $ZrO_2$ vapor-deposited film fabricated by vapor deposition under condition 2 was greater than the value of the $ZrO_2$ vapor-deposited film fabricated by vapor deposition under condition 1.

The absence or presence of the region the major axis length of which as an actual size was equal to or more than 1 nm was determined in an area measuring 130 nm×130 nm. As a result, the cross-sectional TEM image of the $ZrO_2$ vapor-deposited film fabricated by vapor deposition under condition 2 was determined not to have such a region.

By contrast, columnar structures with a major axis length of equal to or more than 1 nm as an actual size were found in the cross-sectional TEM image of the $ZrO_2$ vapor-deposited film fabricated by vapor deposition under condition 1. In the $ZrO_2$ vapor-deposited film fabricated by vapor deposition under condition 1, multiple columnar structures with major axis lengths of 2 nm to 40 nm and minor axis lengths of 0.5 nm to 2 nm as an actual size were observed.

3. Evaluation of Heat Resistance

A $ZrO_2$ vapor-deposited film formed on a plastic lens substrate (product name Eyas, made by HOYA Corp., refractive index 1.6, colorless lens) by the same method as in 1. above was placed for two hours in a heating furnace at the internal furnace temperature shown in Table 4, after which the presence of cracks several cm or more in length in the $ZrO_2$ vapor-deposited film was evaluated under a fluorescent lamp. The presence of cracks was denoted by X and the absence of cracks was denoted by ○. The results are given in Table 2.

TABLE 2

| Internal temperature of heating furnace | Presence of cracks in ZrO$_2$ vapor-deposited film formed under condition 1 | Presence of cracks in ZrO$_2$ vapor-deposited film formed under condition 2 |
| --- | --- | --- |
| 80° C. | x | ○ |
| 85° C. | x | ○ |
| 90° C. | x | ○ |
| 95° C. | x | ○ |
| 100° C. | x | ○ |

Based on the above results, it was determined that the greater the uniformity of the cross-sectional TEM image, the better the heat resistance of the vapor-deposited film.

4. Measurement of Film Stress

By the same method as set forth above, ZrO$_2$ vapor-deposited films were formed on the surface of cover glasses under condition identical to conditions 1 and 2. When the film stress was measured, tensile stress was present under condition 1 and compressive stress under condition 2.

5. Evaluation of Scratch Resistance

A water-repellent film in the form of a fluorine-substituted alkyl group-comprising organic silicon compound made by Shin-Etsu Chemical Co., Ltd., KY130, was vapor deposited by halogen heating on a ZrO$_2$ vapor-deposited film formed on a plastic lens substrate (product name Eyas, made by HOYA Corp., refractive index 1.6, colorless lens) by the same method as in 1. above and samples were prepared.

The samples thus prepared were subjected to a scratch resistance test by running steel wool back and forth 20 times with a load of 1 kg, and a scratch resistance test by running a sand eraser back and forth 5 times with a load of 3 kg. Following the scratch tests, the ZrO$_2$ vapor-deposited film was observed under a fluorescent lamp and the presence or absence of scratches and cracks 5 mm or greater in length was determined. For six or more scratches or cracks, the scratch resistance was evaluated as X, five or fewer but equal to or more than 2 as Δ, and one or none as ○.

6. Measurement of Film Hardness (Indentation Hardness)

ZrO$_2$ vapor-deposited films were formed on plastic lens substrates (product name Eyas, made by HOYA Corp., refractive index 1.6, colorless lens) under conditions 1 and 2 by the same method as in 1. above.

The indentation hardness of the ZrO$_2$ vapor-deposited film that was formed was measured by the following method with a measuring apparatus (Elionix ultra-micro indentation hardness tester ENT-2100).

In measurement, a triangular pyramid diamond indenter with an edge interval of 115 degrees was employed. Measurement conditions were set in the form of an indenter load rate of 0.2 mgf/sec, a maximum load of 0.98 mN maintained for 1 sec, followed by unloading at the same load rate. The indentation depth at maximum load was read from an indenter indentation depth—load curve obtained by this measurement.

The indentation hardness H was calculated from the following equation.

$$H = P_{max}/A(h_A) \quad (1)$$

In the above equation, $P_{max}$ denotes the maximum load, $A(h_A)$ denotes the projected contact area of the indenter. A $(h_A)$ was obtained by first obtaining $h_A$ from the maximum indentation depth $h_{max}$ and the intersection $h_S$ of the unloading curve gradient and the displacement axis, and then from the geometric shape (vertical angle 65.03°) of the regular triangular pyramide (Berkovich type) indenter comprised of diamond. The equations for $h_A$ and A ($h_A$) are both given below:

$$h_A = h_{max} - 0.75(h_{max} - h_S) \quad (2)$$

$$A(h_A) = 3\sqrt{3}\tan^2(65.03°)h_A^2 \quad (3)$$

(In this context, 0.75 in equation (2) is a constant of a Berkovich type indenter.)

In the measurement results, the indentation hardness of the ZrO$_2$ vapor-deposited film formed under condition 2 achieved a higher value than the indentation hardness of the ZrO$_2$ vapor-deposited film formed under condition 1.

The above results are given in Table 3.

TABLE 3

| | Presence of cracks in ZrO$_2$ vapor-deposited film formed under condition 1 | Presence of cracks in ZrO$_2$ vapor-deposited film formed under condition 2 |
| --- | --- | --- |
| Scratch resistance test by running steel wool back and forth 20 times at a load of 1 kg | x | ○ |
| Scratch resistance test by running sand eraser back and forth 5 times at a load of 3 kg | Δ | ○ |
| Indentation hardness | low | high |

From the above results, it was determined that the higher the uniformity of the cross-sectional TEM image, the better the scratch resistance of the vapor-deposited film. The fact that vapor deposition condition permitting the fabrication of vapor-deposited films with good scratch resistance can be determined by the simple method of image analysis without requiring stress or hardness measurement in this manner is one of the advantages afforded by an aspect of the present invention.

When the average grain size and the grain boundary occupancy rate observed in the planar TEM images were obtained by the methods set forth above for the ZrO$_2$ vapor-deposited film prepared under condition 1 and the ZrO$_2$ vapor-deposited film prepared under condition 2, the ZrO$_2$ vapor-deposited film prepared under condition 2 exhibited an average grain size of equal to or greater than 3.5 nm and a grain boundary occupancy rate of less than 15%. By contrast, the ZrO$_2$ vapor-deposited film prepared under condition 1 exhibited a grain boundary occupancy rate exceeding 15% and an average grain size of less than 3.5 nm.

7. Preparation of Eyeglass Lenses

A total of 8 layers of vapor-deposited films, shown in Table 4 below, were sequentially formed by an ion-assisted method using an assist gas in the form of oxygen gas or a mixed gas of oxygen and argon on the surface of a hard coat on the convex side of a plastic lens substrate (product name Eyas, made by HOYA Corp., refractive index 1.6, colorless lens) having a convex surface on the object side and a concave surface on the eyeball side, with both sides having been optically finished and coated with hard coats in advance. After forming the 8th vapor-deposited film, a 9th layer film in the form of a water-repellent layer was formed over it by vapor deposition by halogen heating using a vapor deposition source in the form of KY130, which is a fluorine-substituted alkyl group-comprising organic silicon compound made by Shin-Etsu Chemical Co., Ltd. Two types (eyeglass lenses 1 and 2) were prepared. During the fabrication of eyeglass lens 1, above condition 1 was employed as the vapor deposition condition of the $ZrO_2$ vapor-deposited film. During the fabrication of eyeglass lens 2, above condition 2 was employed as the vapor deposition condition of the $ZrO_2$ vapor-deposited film. The other manufacturing conditions were identical.

TABLE 4

|  | Vapor deposition source | Film thickness (nm) |
|---|---|---|
| 1st layer | $SiO_2$ | 30 |
| 2nd layer | $ZrO_2$ | 10 |
| 3rd layer | $SiO_2$ | 200 |
| 4th layer | ITO | 10 |
| 5th layer | $ZrO_2$ | 30 |
| 6th layer | $SiO_2$ | 20 |
| 7th layer | $ZrO_2$ | 60 |
| 8th layer | $SiO_2$ | 90 |

8. Heat Resistance Test of Eyeglass Lens Samples

The eyeglass lenses fabricated in 7. above were placed for 1 hour in a 100° C. oven, held up to a fluorescent lamp, and visually evaluated for the presence of cracks. As a result, the eyeglass lens 1 that had been fabricated with the $ZrO_2$ vapor-deposited film under condition 1 exhibited many cracks running several cm in length in the $ZrO_2$ vapor-deposited film, but the eyeglass lens 2 that had been fabricated with the $ZrO_2$ vapor-deposited film under condition 2 afforded a high degree of transparence and did not exhibit cracks.

9. Scratch Resistance Test of Eyeglass Lens Samples

The eyeglass lenses fabricated in 7. above were subjected to a scratch resistance test by running steel wool back and forth 20 times with a load of 1 kg, and a scratch resistance test by running a sand eraser back and forth 5 times with a load of 3 kg. As a result, the eyeglass lens that had been fabricated with the $ZrO_2$ vapor-deposited film under condition 1 exhibited several scratches and cracks, but the eyeglass lens fabricated with the $ZrO_2$ vapor-deposited film under condition 2 afforded a high degree of transparence and did not develop scratches or cracks.

Based on the results of 8. and 9., the fabrication of $ZrO_2$ vapor-deposited films under vapor deposition conditions determined to be good for heat resistance and scratch resistance based on the uniformity of the TEM image was confirmed to yield eyeglass lenses having good durability and scratch resistance. Conventionally, the discovery of vapor deposition conditions permitting the forming of vapor-deposited films with good heat resistance and scratch resistance would require repeatedly implementing an accelerated durability test such as the oven heating implemented in 8. above, implementing the scratch resistance tests on eyeglass lens samples that was implemented in 9 above, and selecting candidate conditions. By contrast, an aspect of the invention makes it possible to determine manufacturing conditions permitting the manufacturing of eyeglass lenses having good durability by the simple method of fabricating test vapor-deposited films as well as obtaining the TEM images thereof and evaluating the uniformity.

INDUSTRIAL APPLICABILITY

The present invention is useful in the field of manufacturing eyeglass lenses.

The invention claimed is:

1. An eyeglass lens comprising a lens substrate and a vapor-deposited film either directly or indirectly on the lens substrate, wherein
the vapor-deposited film is an oxide film of zirconium, with an average grain size observed in a planar image obtained by a transmission electron microscope ranging from 3.5 nm to 20 nm and a proportion accounted for by grain boundaries, which are boundaries separating grains from regions outside of the grains, in a planar image obtained by a transmission electron microscope of equal to or greater than 1% and less than 15% based on the entire area of the observed field, which is set to 100 nm square (100 nm×100 nm) to 150 nm square (150 nm×150 nm) at a magnification of 100,000 to 200,000-fold, or 50 nm square (50 nm×50 nm) to 100 nm square (100 nm×100 nm) at a magnification of exceeding 200,000-fold.

2. The eyeglass lens according to claim 1, wherein the grain is a structure comprising an amorphous material.

3. The eyeglass lens according to claim 1, wherein the average grain size ranges from 5.8 nm to 20 nm and the proportion accounted for by the grain boundaries is equal to or greater than 1% and equal to or less than 5% based on the entire area of the observed field.

4. The eyeglass lens according to claim 1, wherein the average grain size ranges from 8.2 nm to 20 nm and the proportion accounted for by the grain boundaries is equal to or greater than 1% and equal to or less than 3% based on the entire area of the observed field.

5. The eyeglass lens according to claim 1, wherein a proportion accounted for by columnar structure or crystalline grains observed in a cross-sectional image of the vapor-deposited film obtained by a transmission electron microscope is equal to or greater than 1% and equal to or less than 10% based on the entire area of the observed field.

6. The eyeglass lens according to claim 1, which comprises the vapor-deposited film as at least one layer in a multilayer vapor-deposited film.

7. The eyeglass lens according to claim 1, wherein the average grain size ranges from 3.5 nm to 11.5 nm.

8. The eyeglass lens according to claim 1, wherein the proportion accounted for by the grain boundaries in a planar image obtained by a transmission electron microscope is equal to or greater than 1% and equal to or less than 10% based on the entire area of the observed field.

9. The eyeglass lens according to claim 1, wherein the lens substrate is a plastic lens substrate.

\* \* \* \* \*